(12) United States Patent
Kato et al.

(10) Patent No.: US 7,855,506 B2
(45) Date of Patent: Dec. 21, 2010

(54) ELECTRIC FIELD LIGHT EMITTING ELEMENT

(75) Inventors: Yoshifumi Kato, Kariya (JP); Norihito Takeuchi, Kariya (JP); Hiroyasu Kawauchi, Kariya (JP); Haruyuki Ishikawa, Kariya (JP); Hiroyuki Miura, Kariya (JP)

(73) Assignee: Kabushiki Kaisha Toyota Jidoshokki, Aichi-ken (JP)

( * ) Notice: Subject to any disclaimer, the term of this patent is extended or adjusted under 35 U.S.C. 154(b) by 877 days.

(21) Appl. No.: 10/574,371

(22) PCT Filed: Jul. 26, 2004

(86) PCT No.: PCT/JP2004/010631

§ 371 (c)(1),
(2), (4) Date: Jan. 25, 2007

(87) PCT Pub. No.: WO2005/034586

PCT Pub. Date: Apr. 14, 2005

(65) Prior Publication Data

US 2007/0210700 A1    Sep. 13, 2007

(30) Foreign Application Priority Data

Oct. 2, 2003    (JP) .............................. 2003-344873

(51) Int. Cl.
  *H01J 1/62* (2006.01)
(52) U.S. Cl. .................. 313/506; 313/503; 313/504; 313/509
(58) Field of Classification Search .......... 313/498–512
  See application file for complete search history.

(56) References Cited

U.S. PATENT DOCUMENTS 6,787,989 B2   9/2004  Wada et al.
7,234,984 B2   6/2007  Nishikawa et al.

(Continued)

FOREIGN PATENT DOCUMENTS

JP       04-082197       3/1992

(Continued)

OTHER PUBLICATIONS

English Translation of International Preliminary Examination Report Office Action issued in Japanese counterpart application dated Jul. 6, 2006 (7 pages).

(Continued)

*Primary Examiner*—Bumsuk Won
(74) *Attorney, Agent, or Firm*—Locke Lord Bissell & Liddell LLP

(57) ABSTRACT

An organic EL element that is an electroluminescence element has at least an organic layer held between a pair of electrodes. At least an electrode made of material having a higher volume resistivity, of the pair of electrodes, is formed in a flat form. The organic layer is provided with a plurality of non-light emitting portions. The non-light emitting portions are provided so that a larger number of non-light emitting portions exist per unit area at a position physically closer to the position of a terminal portion at which the electrode made of material having the higher volume resistivity is connected to an external connection terminal. As a result, the level of current passing per unit area is substantially uniform at each position on the element.

11 Claims, 7 Drawing Sheets

U.S. PATENT DOCUMENTS

| | | | |
|---|---|---|---|
| 7,521,861 B2 * | 4/2009 | Kawauchi et al. | 313/506 |
| 2004/0202777 A1 | 10/2004 | Nishikawa et al. | |
| 2005/0264182 A1 * | 12/2005 | Seki | 313/503 |
| 2006/0214157 A1 * | 9/2006 | Kawauchi et al. | 257/40 |

FOREIGN PATENT DOCUMENTS

| | | |
|---|---|---|
| JP | 05-020294 | 3/1993 |
| JP | 05-226076 | 9/1993 |
| JP | 05-307997 | 11/1993 |
| JP | 05-315073 | 11/1993 |
| JP | 08-167479 | 6/1996 |
| JP | 09-306669 | 11/1997 |
| JP | 10-050481 | 2/1998 |
| JP | 11-040362 | 2/1999 |
| JP | 11-260560 | 9/1999 |
| JP | 11-273869 | 10/1999 |
| JP | 11-339960 | 12/1999 |
| JP | 2000-082588 | 3/2000 |
| JP | 2000-173771 | 6/2000 |
| JP | 2000-231985 | 8/2000 |
| JP | 2000-252063 | 9/2000 |
| JP | 2002-83693 | 3/2002 |
| JP | 2002-318556 | 10/2002 |
| JP | 2003-272844 | 9/2003 |
| JP | 2004-335319 | 11/2004 |

OTHER PUBLICATIONS

Miyata, Seizo "Organic EL Elements and Front of Their Industrialization", NTS Co., Ltd., Nov. 30, 1998, pp. 46-47.

Office Action (dated Jul. 14, 2009) from Japanese counterpart application No. 2005-514359 (no English translation).

* cited by examiner

ELECTRIC FIELD LIGHT EMITTING ELEMENT

FIELD OF THE INVENTION

The present invention relates to an electroluminescence element having at least a light emitting layer held between a pair of electrodes.

BACKGROUND OF THE INVENTION

Previously, displays, lighting systems and the like using an organic electroluminescence element (hereinafter referred to as an organic EL element as appropriate), which is an electroluminescence element, have been proposed. The organic EL element has a structure in which an organic layer having an organic light emitting region containing an organic light emitting material is held between a pair of electrodes.

However, mere employment of the above structure does not lead to completion of the organic EL element, and for example, at least one electrode should be capable of injecting electric charges (holes or electrons) into the organic layer and have transparency to light emitted at the organic light emitting region for extracting light to outside the element. In addition, for the organic layer, a material transporting electric charges injected from the electrode, recombining the electric charges to create an excited state, and emitting light when turning from the excited state to a ground state should be selected.

Therefore, materials for forming the organic EL element are extremely limited, and in most cases, there is no other choice but to use a material having a high volume resistivity for the transparent electrode and the organic layer.

Thus, there arises a problem that the current density at the organic layer varies depending on the position. A mechanism for this will be described below.

Generally, an electrode on the side through which light is extracted to outside the element is composed of a material having a higher volume resistivity, such as ITO, and the other electrode is composed of a material of which the volume resistivity is negligible compared with the electrode on the light extraction side. Thus, when resistance values in an infinite number of current paths in the organic EL element are considered, the length of passage over the electrode on the light extraction side on the paths may be examined.

If this examination is conducted, it will be apparent that a current path extending from a terminal portion of the electrode on the light extraction side through the electrode on the light extraction side to the other electrode by way of the organic layer at a position close to the terminal portion has a resistance value lower than that of a current path extending to the other electrode from the organic layer at a position distant from the terminal portion. That is, the current density in the organic layer at a position close to the terminal portion on the light extraction side is greater than the current density at a position distant from the terminal portion.

In this connection, the electrode on a side opposite to the light extraction side may be made of material having a volume resistivity higher than that of the electrode on the light extraction side. In this case, the position of the electrode on the light extraction side and the position of the other electrode may be mutually exchanged in the explanation described above.

As described above, it is difficult to equalize current densities at positions in the organic layer in the plane, and therefore, for example, the following phenomenon may occur.

Occurrence of Luminance Unevenness

Since there are locations where a large amount of current passes and where only a small amount of current passes, luminance unevenness occurs throughout the element. The luminance of the organic electroluminescence element becomes high as the amount of passing current increases (see, for example, Non-Patent Document 1), and therefore if there are locations where a large amount of current passes and where a small amount of current passes, a difference in luminance occurs between the locations, resulting in luminance unevenness.

For solving this problem, various techniques have been proposed.

For example, there is a prior art in which unloading portions (the terminal portions described above) for application of voltages are provided at many locations (see, for example, Patent Document 1). However, the size of an apparatus such as a portable terminal in which the organic EL element is incorporated is limited, and therefore the size of the organic EL element is also limited. Thus, provision of a large number of unloading portions as in the prior art is effective for solving the problem described above, but is extremely difficult to employ from a practical viewpoint. In addition, provision of a plurality of terminal portions leads to a problem that the proportion of the wirings for connecting the terminal portions to external drive circuit in the apparatus increases.

A prior art in which an auxiliary electrode made of material having a lower volume resistivity is placed on an electrode made of material having a higher volume resistivity is known. For example, a technique in which the auxiliary electrode is placed in one edge at a position where front and back sides are opposite to each other between a light emitting layer (the organic layer described above) and a transparent conductive film (the electrode described above) has been proposed (see, for example, Patent Document 2). This prior art is appropriately employed, but cannot completely solve the problem described above.

A prior art in which in-plane thickness fluctuations of layers constituting the organic layer are set to a predetermined value (see, for example, Patent Document 3), and a prior art in which the thickness of a light emitting layer in the organic layer (organic light emitting region) is adjusted at each position in the light emitting layer so that the luminance is uniform in the plane (see, for example, Patent Document 4) have been proposed. These prior arts can be appropriately employed, but it is extremely difficult from a practical viewpoint to change the thickness of each layer on a position-by-position basis in production of the organic EL element. In addition, for realizing the techniques, a special manufacturing method should be employed, and a manufacturing apparatus for realizing the manufacturing method should be fabricated.

A prior art relating to a line light source in which a light emitting region is segmented into a plurality of regions and the light emitting regions are connected in series has been proposed (see, for example, Patent Document 5). More specifically, it is a technique in which a plurality of thin film light emitting elements (light emitting regions) are connected in series to equalize the values of currents passing through the thin film light emitting elements, and the areas of the thin film light emitting elements are equalized to equalize current densities in the light emitting elements, whereby the luminances of the thin film light emitting elements are equalized.

In addition, in an inorganic electroluminescence element (hereinafter referred to as inorganic EL element as appropriate), which is an electroluminescence element, similar problems have arisen.

[Patent Document 1] Japanese Laid-Open Patent Publication No. 5-315073 (claim 1, paragraph [0002])

[Patent Document 2] Japanese Laid-Open Utility Model Publication No. 5-20294 (claim 1)

[Patent Document 3] Japanese Laid-Open Patent Publication No. 11-339960 (claim 1)

[Patent Document 4] Japanese Laid-Open Patent Publication No. 11-40362 (claim 2, FIG. 1)

[Patent Document 5] Japanese Laid-Open Patent Publication No. 2000-173771 (paragraphs [0040]-[0046], paragraphs [0060]-[0065] FIG. 5, FIG. 7)

[Non-Patent Document 1] "Organic EL Elements and Front of Their Industrialization" supervised by Seizo Miyata, NTS CO., LTD., issued on 30 Nov., 1998, p. 46-47, FIG. 9

DISCLOSURE OF THE INVENTION

Accordingly, it is an objective of the present invention to provide an electroluminescence element having a novel configuration for bringing a luminance distribution of an element into a desired state. "Desired states" include a state in which the luminance is substantially uniform throughout the element, a state in which the luminance of the central part is higher than that of the opposite sides or the periphery, and a state in which the luminance of any display area in an image or the like is high.

For achieving the objective described above, the present invention provides an electroluminescence element which can emit light at least by application of a voltage to a pair of electrodes, wherein the electroluminescence element has a light emitting portion and a non-light emitting portion, and the light emitting portion and non-light emitting portion are provided so that they have a distribution for bringing the luminance distribution of the element into a desired state.

It is preferable that the light emitting portion and non-light emitting portion are provided so that the luminance distribution is substantially uniform in the whole.

In a preferred example, an electrode made of material having a higher volume resistivity in the pair of electrodes is formed in a flat form, and the non-light emitting portion is provided so that the area occupied by non-light emitting portion per unit area is greater at a position physically closer to the position of a terminal portion of the electrode made of material having the higher volume resistivity.

In a preferred example, an electrode made of material having a higher volume resistivity in the pair of electrodes is formed in a flat form, and the light emitting portion is provided so that the area occupied by the light emitting portion per unit area is greater at a position physically further to the position of the terminal portion of the electrode made of material having the higher volume resistivity.

It is preferable that the light emitting portion and non-light emitting portion are provided so that the central part of the element is brighter than other parts as a luminance distribution of the element.

In a preferred example, the non-light emitting portion is provided so that the area occupied by the non-light emitting portion per unit area is greater in a region with a higher rate at which the luminance of the electroluminescence element emitting light is to be reduced compared to a state in which the non-light emitting portion is not provided.

It is preferable that the electroluminescence element is an organic electroluminescence element in which at least an organic layer which can emit light by application of a voltage is held between a pair of electrodes.

It is preferable that the non-light emitting portion is constructed by providing a part made of material having a work function greater than that of a material of a cathode of the pair of electrodes between the cathode and the organic layer.

It is preferable that the non-light emitting portion is constructed by providing a part made of material having a work function smaller than that of a material of an anode of the pair of electrodes between the anode and the organic layer.

It is preferable that the non-light emitting portion is constructed by modifying the organic layer to be incapable of emitting light.

It is preferable that the light emitting portion is constructed by providing an electron injection layer between the cathode of the pair of electrodes and the organic layer.

It is preferable that the light emitting portion is constructed by modifying a predetermined part of the anode of the pair of electrodes to have a work function greater than that of other parts of the anode.

It is preferable that the electroluminescence element has the organic layer provided only on the part of the light emitting portion.

The electroluminescence element may be an inorganic electroluminescence element.

It is preferable that the non-light emitting portion is constructed by providing an insulating portion between at least one electrode of the pair of electrodes and the organic layer.

It is preferable that the electroluminescence element is formed on a substrate and constructed as a bottom emission type, and light reflection layers are provided at positions corresponding to the insulating portion between the substrate and a transparent electrode.

DETAILED DESCRIPTION OF THE PREFERRED EMBODIMENTS

An electroluminescence element according to one embodiment will be described below with reference to FIGS. 1 to 4. In this embodiment, the electroluminescence element is an organic EL element having a substantially uniform luminance throughout the element as a desired state of the luminance distribution of the element. In FIGS. 1 to 4, same, equivalent or like members are given same numbers. In addition, FIGS. 1 to 4 do not represent the actual organic EL element, but schematically show its configuration for explaining its configuration and the like, and the dimension of one or several parts is extremely exaggerated. In addition, the hatching in the cross-sectional view is omitted in some cases.

Figure 1:
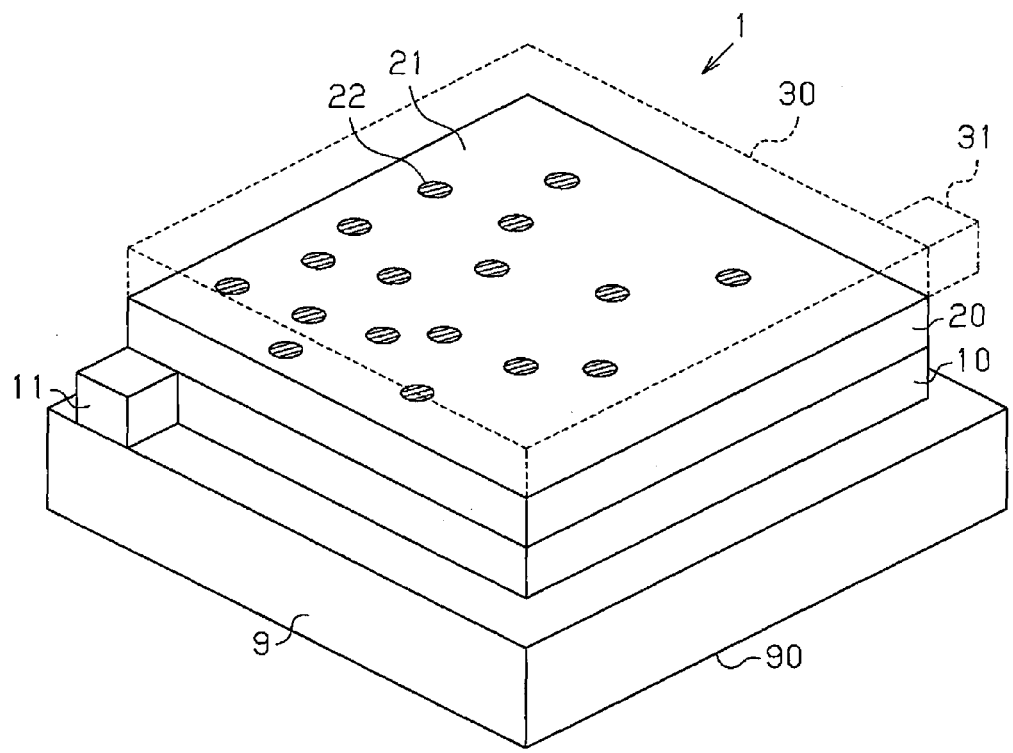
FIG. 1 is a schematic perspective view of an organic EL apparatus comprising an organic EL element of the present invention.

FIG. 1 shows a schematic perspective view of a bottom emission type organic EL apparatus in which an organic EL element 1 according to the present invention is deposited on a transparent substrate 9, and light is extracted to outside from the side of the transparent substrate 9. The organic EL element shown in FIG. 1 has a transparent electrode 10, an organic layer 20 and a back electrode 30 formed in this order from the side of the transparent substrate 9. In FIG. 1, the back electrode 30 is drawn by a broken line for clarifying the configuration of the organic layer 20.

First, a light emitting portion 21 and non-light emitting portions 22 will be described.

<Light Emitting Portion 21 and Non-light Emitting Portions 22>

The organic layer 20 is a layer which contains an organic light emitting material and emits light with a current passing when a voltage is applied between the transparent electrode 10 and the back electrode 30. More specifically, the organic layer 20 comprises a part which actually emits light when a voltage is applied (light emitting portion 21) and parts which do not emit light (non-light emitting portions 22).

In this embodiment, the transparent electrode 10 is composed of a material having a volume resistivity higher than that of the back electrode 30, and a part denoted by reference numeral 11 in FIG. 1 is a terminal portion which is connected to an external connection terminal (not shown) of an external drive circuit. In addition, the volume resistivity of a material forming the back electrode 30 is negligible compared to the volume resistivity of a material forming the transparent electrode 10. The negligible level means that the former is, for example, 1/10 of the latter or less.

Figure 2:
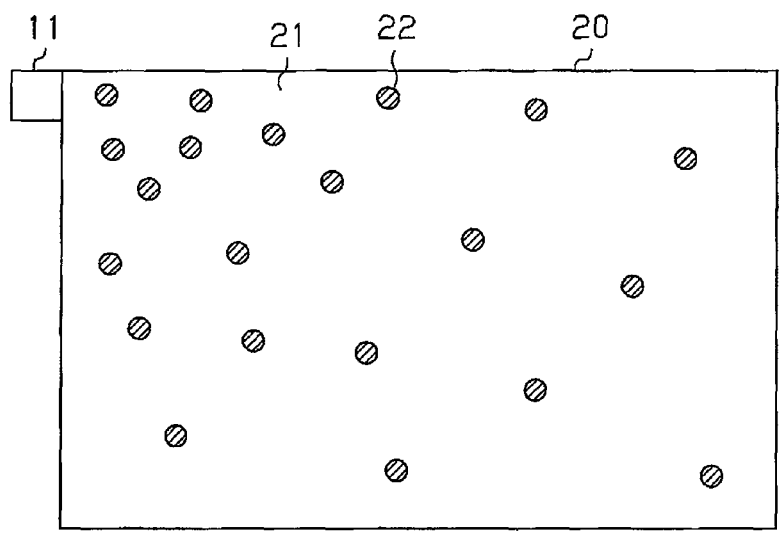
FIG. 2 is a schematic front view for explaining an organic layer provided on the organic EL element of FIG. 1.

In this configuration, in the organic layer 20, the area occupied by the non-light emitting portions 22 per unit area decreases as the distance from the terminal portion 11 becomes further as shown in FIG. 2. In other words, the area occupied by the light emitting portion 21 per unit area increases as the distance from the terminal portion 11 becomes further.

By achieving the configuration described above, the amount of light emitted per unit area in the organic layer can be made substantially uniform irrespective of the distance from the terminal portion 11. This mechanism will be described below.

As described previously, the resistance value of a current path extending from the terminal portion 11 of the transparent electrode 10 through the transparent electrode 10 to the back electrode 30 by way of the organic layer 20 has a correlation with the length occupied by the transparent electrode 10 in this path. That is, a current path extending from the transparent electrode 10 to the back electrode 30 by way of the organic layer 20 at a position closer to the terminal portion 11 has a lower resistance value because the length occupied by the transparent electrode 10 in this path is shorter. That is, a large amount of current passes through this path.

The organic EL element 1 is designed so that the area occupied by the non-light emitting portions 22 per unit area is greater at a position closer to the terminal portion 11. Namely, the area of the light emitting portion 21 per unit area increases as going away from the terminal portion 11.

Thus, in the organic layer 20, the current density in the light emitting portion 21 increases but a current-passable area decreases as approaching the terminal portion 11. Conversely, the current density in the light emitting portion 21 decreases but a current-passable area increases as going away from the terminal portion 11.

Thus, by employing the configuration described above, the amount of current passing per unit area sufficiently larger than the area of one non-light emitting portion 22 can be made substantially uniform irrespective of the distance from the terminal portion 11 in the organic layer 20. That is, this advantage can be obtained if the area occupied by the non-light emitting portions 22 per unit area is greater at a position closer to the terminal portion 11 composed of a material having a higher volume resistivity. In other words, the advantage can be obtained if the area occupied by the light emitting portion 21 per unit area is greater at a position more distant from the terminal portion 11.

The optimum distribution of the non-light emitting portions 22 in the organic layer 20 varies depending on the performance of the organic element 1, namely the material and thickness of each layer constituting the organic EL element 1 and the manufacturing method, and therefore the organic EL element 1 may appropriately be designed in accordance with these conditions, but is preferably designed so that the luminance is substantially uniform in the whole. That is, the distribution of the non-light emitting portions 22 may be set so that the amount of light emitted by the organic layer per unit area is uniform when a general drive voltage (e.g. about 5 V) is applied between the transparent electrode 10 and the back electrode 30. The "luminance substantially uniform in the whole" means that a value (%) obtained by segmenting a light emission region into a plurality of regions, dividing the minimum value of luminances of the regions by the maximum value thereof, and multiplying the resulting value by 100 is 70% or greater when the organic EL element 1 is seen from the light emission side, i.e. the side of the transparent substrate 9 in this embodiment. The area of the aforementioned region is sufficiently larger than the area of one non-light emitting portion 22, and is, for example, several square millimeters.

In addition, the size of each non-light emitting portion 22 in the plane direction of the organic layer 20 is preferably a level of size at which each non-light emitting portion 22 cannot be observed by the unaided eye when the organic EL element 1 is seen from outside, and generally, the distance between two most distant points within each non-light emitting portion 22 is about 300 μm or less. In addition, if a member having a diffusion capability such as, for example, a diffusion plate is provided on the light extraction side from the organic layer 20, the aforementioned distance is preferably about 500 μm or less.

A specific configuration of the non-light emitting portions 22 and a specific method for formation of the non-light emitting portions 22 will now be described.

(Non-Light Emitting Portions 22)

As described previously, each non-light emitting portion 22 is a part which does not emit light even if a voltage is applied between the transparent electrode 10 and the back electrode 30 in the organic EL element 1, and specifically, a region which does not emit light can be provided according to, for example, the configuration described below.

Figure 3A:
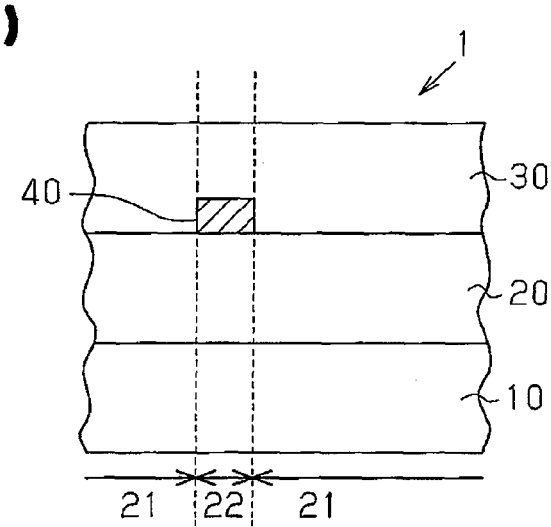
FIGS. 3(a) to 3(c) are schematic cross-sectional views for explaining a first example of the configuration of a light emitting portion and a non-light emitting portion of the organic EL element of FIG. 1.
Figure 3B:
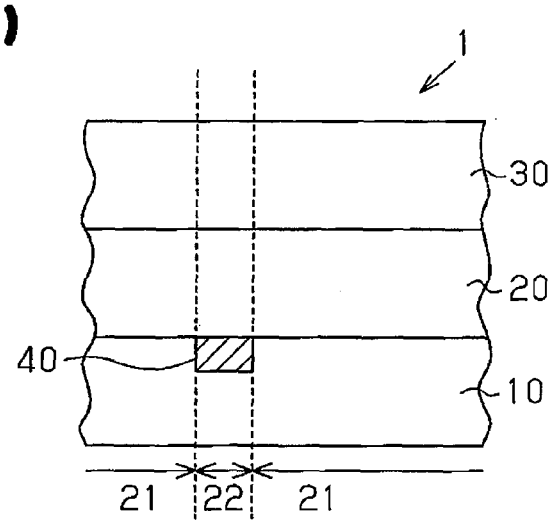
Figure 3C:
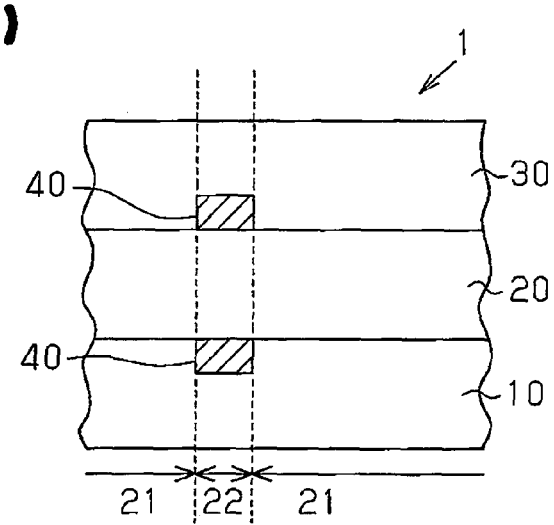

(1) As shown in the cross-sectional views of FIGS. 3(*a*) to 3(*c*), insulating portions 40 are provided on an area between the organic layer 20 and the transparent electrode 10 and/or an area between the organic layer 20 and the back electrode 30, which correspond to the non-light emitting portions 22.

That is, as shown in FIG. 3(*a*), the insulating portions 40 may be provided so as to contact a side of the organic layer 20 that corresponds to the back electrode 30 to form the non-light emitting portions 22, and as shown in FIG. 3(*b*), the insulating portions 40 may be provided so as to contact a side of the organic layer 20 that corresponds to the transparent electrode 10 to form the non-light emitting portions 22. Alternatively, as shown in FIG. 3(*c*), the insulating portions 40 may be provided on both sides of the organic layer 20.

Consequently, no electric charge (hole and/or electron) is injected into an area corresponding to each insulating portion 40 of the organic layer when a voltage is applied, and therefore no light is emitted from the organic layer 20 of the non-light emitting portions 22.

For the insulating portions 40, an insulating material capable of being used in a publicly known organic EL element may be provided so as to contact the entire surface of the organic layer 20 in the non-light emitting portion using a publicly known thin film formation process such as a vapor deposition process or a CVD process.

If the organic layer 20 employs a layered structure, the insulating portions 40 may be provided on at least one of layers constituting the organic layer 20.

As a material for forming the insulating portions 40, a material having a volume resistivity approximately ten times as high as the volume resistivity of the transparent electrode 10 or greater may be employed, and such materials may include, for example, transparent polymers, oxides and glass.

More specifically, preferred transparent polymers include polyimide, fluorinated polyimide, fluororesin, polyacrylate, polyquinoline, polyoxadiazole, polyolefin having a cyclic structure, polyallylate, polycarbonate, polysulfone and ladder type polysiloxane.

In addition, preferred oxides may include $SiO_2$, $Al_2O_3$, $Ta_2O_3$, $Si_3N_4$, fluorine-added $SiO_2$, MgO and $YbO_3$ as preferred examples of materials capable of being subjected to etching processing. Such materials are easily subjected to etching processing and therefore can form the insulating portions 40 into any (preferred) shape.

Further, in addition to the aforementioned materials, a photosensitive photoresist and a cured product thereof may suitably be employed. This is because the insulating portions 40 can be processed into any shape as described above by a photoresist process.

The organic layer 20 or the like is easily deteriorated by water, oxygen and the like, and therefore for the insulating portions 40, a material having a water content of 0.1 wt % or less and a gas permeation coefficient (JISK 7126) of $1\times10^{-13}$ cc·cm/(cm²·s·cmHg) or less is preferably employed. Such materials include, for example, inorganic oxides, inorganic nitrides and compositions of the oxides and nitrides.

The insulating portions 40 may have a function of transmitting light of a wavelength emitted from the organic layer 20 (transmission function), a function of scattering the light (scattering function), a function of reflecting the light (reflection function) and the like.

The insulating portions 40 preferably have a function of reflecting light of a wavelength emitted from the organic layer 20 (reflection function) if the insulating portions 40 are provided on a side opposite to the light extraction side of the organic layer 20 and particularly, the back electrode 30 has a reflection function. Consequently, the traveling direction of light emitted from the organic layer 20 and emitted to a side opposite to the light extraction side can be diverted to the light extraction side. In addition, the non-light emitting portions 22 do not emit light, but light exits therefrom to some degree, and therefore the possibility of being determined as a "dark spot" (observed by the unaided eye) can extremely be reduced.

If the back electrode 30 has a function of absorbing light emitted from the organic layer 20 (absorption function) for the purpose of improving the contrast and the like, the insulating portion 40 is preferably made to have an absorption function. For making the insulating portions 40 have an absorption function, a material absorbing the light may be selected from the materials described above to form the insulating portions 40 when the insulating portions 40 are formed. Alternatively, only the periphery of each insulating portion 40 may be made of such material.

In addition, the insulating portions 40 may have a transmission function. Consequently, light emitted from the organic layer 20 to a side opposite to the light extraction side can be allowed to arrive at the back electrode 30. That is, if having a function such as, for example, a reflection function, the back electrode 30 can exhibit the function even in the non-light emitting portions 22 as in the light emitting portion 21.

Of course, the insulating portion 40 can be made to have any other known function other than the aforementioned capabilities.

For making the non-light emitting portions 22 have a transmission function, the insulating portions 40 may be fabricated using a material which is transparent to the light when formed into the insulating portions 40 among the materials described above. In addition, the scattering function can be achieved by a known method such as a method in which beads or the like made of material having a different refractive index are dispersed in each insulating portion 40. The reflection function can be achieved by selecting a material having a reflection function from the materials described above to form the insulating portions 40. Alternatively, reflection members may be provided to adjoin each insulating portion 40 separately from the insulating portion 40.

The scattering function and the reflection function may be provided only in a part of each insulating portion 40, such as only the surface of the insulating portion 40.

(2) In the non-light emitting portions 22, at least one of the transparent electrode 10, the organic layer 20 and the back electrode 30 is not provided.

Figure 4A:
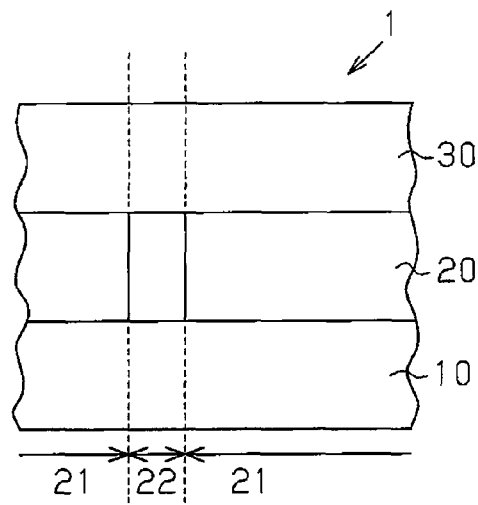
FIGS. 4(a) to 4(c) are schematic cross-sectional views for explaining a second example of the configuration of the light emitting portion and the non-light emitting portion of the organic EL element.
Figure 4B:
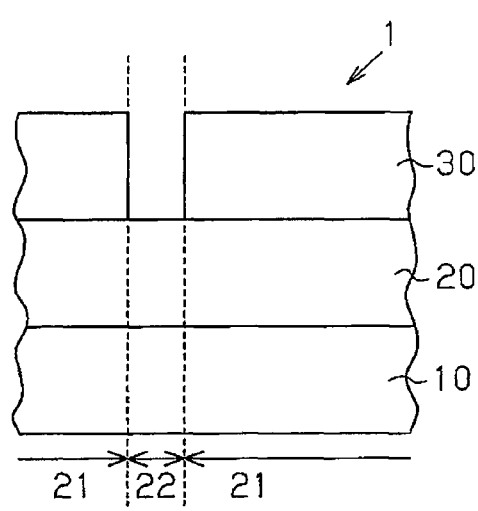
Figure 4C:
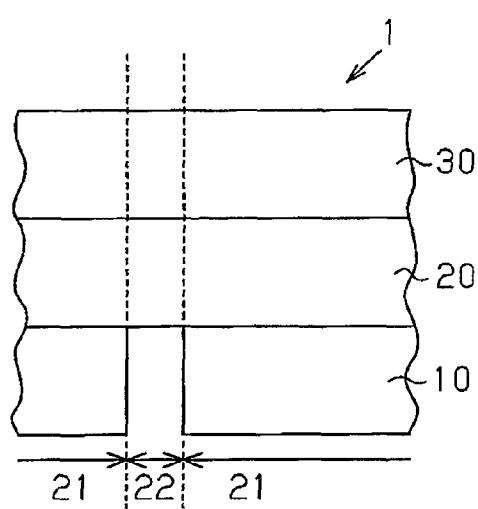

The non-light emitting portions 22 can be formed even if, for example, the organic layer 20 in the non-light emitting portions 22 is not provided as shown in FIG. 4(*a*), the back electrode 30 in the non-light emitting portions 22 is not provided as shown in FIG. 4(*b*), or the transparent electrode 10 in the non-light emitting portions 22 is not provided as shown in FIG. 4(*c*). Of course, the non-light emitting portions 22 can be constructed even if none of these layers or even no layer is provided.

If the configuration described above is employed, no current passes through the organic layer 20 on an area corresponding to the non-light emitting portions 22, and therefore light is not emitted from the non-light emitting portions 22.

In addition, if this configuration is employed, the amount of material required for forming the organic EL element 1 can be reduced as a result of not providing some layer in the non-light emitting portions 22.

For creating such a configuration, for example, the following manufacturing method may be employed.

The transparent electrode 10 and the like are provided on only the light emitting portion 21 using a method for forming a thin film on a fine region using a mask or the like.

The transparent electrode 10 and the like are provided using a method allowing a thin film to be formed on a fine region, such as a printing method.

The transparent electrode 10 and the like are provided, and the transparent electrode 10 and the like on an area corresponding to the non-light emitting portions 22 are then removed using a known fine processing method (removal method) such as mechanical removal, dry etching or wet etching.

In addition, a protective member for protecting the organic EL element 1 may be placed at a location in the non-light emitting portions 22 where the transparent electrode 10 and the like are not provided. This is intended for preventing existence of a material, such as air, deteriorating the organic EL element 1 in the region or maintaining the flatness of each layer constituting the organic EL element 1. For example, if the organic layer 20 and the back electrode 30 are provided on a region where no transparent electrode 10 is provided, steps may arise in the organic layer 20 and the back electrode 30. In addition, if the back electrode 30 is provided on a region where no organic layer 20 is provided, the transparent electrode 10 and the back electrode 30 may be short-circuited.

(3) The organic layer 20 in the non-light emitting portions 22 is made to have a thickness greater than that in the light emitting portion 21.

The organic layer 20 has a higher volume resistivity, and therefore if the aforementioned configuration is employed, the specific resistance of a current path extending through the non-light emitting portions 22 increases, a current becomes hard to pass compared to the light emitting portion 21, and substantially, light is no longer emitted.

(4) The organic layer 20 is modified so that light is not emitted even when a voltage is applied.

The organic layer 20 is substantially uniformly formed on the transparent electrode 10, and the organic layer 20 is then modified by applying an ultraviolet ray or a laser to the organic layer 20 situated on the non-light emitting portions 22, so that light is not emitted even when a voltage is applied. The region thus processed may be determined to be the non-light emitting portions 22.

A general configuration of the organic layer 20, a method for manufacturing the same, and so on will now be described.

<Organic Layer 20>

The organic layer 20 is a layer provided between the transparent electrode 10 and the back electrode 30 and containing an organic light emitting material that emits light when a voltage is applied to the electrodes, a known layer structure in a known organic EL element and a known material may be used for the organic layer 20, and the organic layer 20 may be manufactured by a known manufacturing method.

The organic layer 20 may have any structure as long as the organic layer achieves at least the following functions, and for example, the organic layer may have a layered structure, in which each layer performs one of the following functions, or a single layer structure, by which the following functions are achieved.

Electron Injection Function

A function to inject electrons from the electrode (cathode). Electron injection property.

Hole Injection Function

Holes are injected from the electrode (anode). Hole injection property.

Carrier Transport Function

A function to transport at least either electrons or holes. Carrier transport property.

A function for transporting electrons is referred to as an electron transport function (electron transport property) and a function for transporting holes is referred to as a hole transport function (hole transport property).

Light Emitting Function

A function to generate excitons (create an excited state) by recombining injected and transported electrons and holes and to emit light when returning to a ground state.

When the transparent electrode 10 is an anode, the organic layer 20 may be constructed by, for example, providing a hole injection transport layer, a light emitting layer and an electron injection transport layer in this order from the side corresponding to the transparent electrode 10.

The hole injection transport layer is a layer for transporting holes from the anode to the light emitting layer. A material for forming the hole transport layer may be selected from, for example, low molecular materials such as metal phthalocyanines such as copper phthalocyanine and tetra(t-butyl)copper phthalocyanine, nonmetal phthalocyanines, quinacridone compounds, and aromatic amines such as 1,1-bis(4-di-p-tolylaminophenyl)cyclohexane, N,N'-diphenyl-N,N'-bis(3-methylphenyl)-1,1'-biphenyl-4,4'-diamine, and N,N'-di(1-naphthyl)-N,N'-diphenyl-1,1'-biphenyl-4,4'-diamine, polymeric materials such as polythiophene and polyaniline, polythiophene oligomer materials, and other existing hole transport materials.

The light emitting layer is a layer that is excited by recombining holes transported from the anode with electrons transported from cathode, and emits light when returning to ground state from excited state. As material for the light emitting layer, fluorescent material or phosphorescent material may be employed. A dopant (fluorescent material or phosphorescent material) may be included in the host material.

As materials for forming the light emitting layer, for example, low molecular materials such as 9,10-diallylanthracene derivative, pyrene derivatives, coronene derivatives, perylene derivatives, rubrene derivatives, 1,1,4,4-tetraphenylbutadiene, tris(8-quinolinolate)aluminum complexes, tris(4-methyl-8-quinolinolate)aluminum complexes, bis(8-quinolinolate)zinc complexes, tris(4-methyl-5-trifluoromethyl-8-quinolinolate)aluminum complexes, tris(4-methyl-5-cyano-8-quinolinolate)aluminum complexes, bis(2-methyl-5-trifluoromethyl-8-quinolinolate)[4-(4-cyanophenyl)phenolate]aluminum complexes, bis(2-methyl-5-cyano-8-quinolinolate)[4-(4-cyanophenyl)phenolate]aluminum complexes, tris(8-quinolinolate)scandium complexes, bis[8-(para-tosyl)aminoquinoline]zinc complexes, cadmium complexes, 1,2,3,4-tetraphenylcyclopentadiene, pentaphenylcyclopentadiene, poly-2,5-diheptyloxy-para-phenylenevinylene, coumarin phosphors, perylene phosphors, pyran phosphors, anthrone phosphors, porphyrin phosphors, quinacridone phosphors, N,N'-dialkyl substituted quinacridone phosphors, naphthalimide phosphors, N,N'-dialyl substituted pyrrolopyrrole phosphors, polymeric materials such as polyfluorene, polyparaphenylenevinylene, and polythiophene, and other existing luminescent materials may be used. When employing a host-guest structure, the host and the guest (dopant) may be selected from the above material.

The electron injection transport layer is a layer that transports electrons from the cathode (in this example, a back electrode 30) to the light emitting layer. Materials for forming the electron transport layer include, for example, 2-(4-biphenylyl)-5-(4-t-butylphenyl)-1,3,4-oxadiazole, 2,5-bis(1-naphthyl)-1,3,4-oxadiazole, oxadiazole derivatives, bis(10-hydroxybenzo[h]quinolinolate)beryllium complexes, and triazole compounds.

The organic layer 20 may be provided with layers that can be employed in a known organic electroluminescence layer such as a buffer layer, a hole block layer, an electron injection layer, and a hole injection layer as a matter of course. The layers can be provided using a known material and a known manufacturing method. For example, the electron injection transport layer may be separated into an electron injection layer that is in charge of electron injection function and an electron transport layer that is in charge of electron transport function, which are then laminated to each other. Material for forming each layer may be selected as required from known material in accordance with the function of the layer. That is, material for forming each layer may be selected from the above listed materials for forming the electron injection transport layer.

The transparent electrode 10 and the back electrode 30 will now be described at the same time.

<Electrodes>

One of the transparent electrode 10 and the back electrode 30 functions as an anode, and the other functions as a cathode. In this embodiment, any one of the electrodes may be an anode (or cathode). First, the anode will be described.

(Anode)

The anode is an electrode for injecting holes into the organic layer 20.

The material for forming the anode may be any material as long as the material imparts the aforementioned properties to the electrode, and in general, a known material such as a metal, an alloy, an electrically conductive compound or a mixture thereof is selected.

Examples of material used for forming the anode are listed below:

metal oxides and metal nitrides such as ITO (indium-tin-oxide), IZO (indium-zinc-oxide), tin oxide, zinc oxide, zinc aluminum oxide and titanium nitride;

metals such as gold, platinum, silver, copper, aluminum, nickel, cobalt, lead, chromium, molybdenum, tungsten, tantalum and niobium;

alloys of above listed metals, alloys of copper iodide, and the like; and conductive polymers such as polyaniline, polythiophene, polypyrrole, polyphenylenevinylene, poly(3-methylthiophene) and polyphenylene sulfide.

When the transparent electrode 10 is an anode, a setting is generally made so that the transmittance for light to be extracted becomes greater than 10%. When extracting light in a visible region, ITO having a high transmittance in a visible region is suitably used.

When the back electrode 30 is an anode, the electrode is preferably constructed as a reflecting electrode. In this case, a material having a function of reflecting light to be extracted to outside is selected as required among the aforementioned materials, and in general, a metal, an alloy or a metallic compound is selected.

For preventing a contrast or the like, and reflection of external light, the back electrode 30 may be made to have a function of absorbing light. For making the back electrode 30 having the absorption function, a material exhibiting the absorption function when forming the electrode may appropriately be selected from the materials listed above.

The anode may be made of one kind of the above mentioned material or a mixture of materials. The anode may have a multilayered structure comprising multiple layers of the same composition or different compositions.

The thickness of the anode depends on the material used but is generally selected within the range of about 5 nm to 1 µm, more preferably about 10 nm to 1 µm, further preferably about 10 nm to 500 nm, particularly preferably about 10 nm to 300 nm, and desirably about 10 nm to 200 nm.

The anode is formed using the above mentioned materials by a known film formation process such as a sputtering process, an ion plating process, a vacuum deposition process, a spin coating process and an electron beam evaporation process.

The sheet electric resistance of the anode is preferably equal to or less than several hundreds $\Omega/\square$ (ohm per square), more preferably about 5 to 50$\Omega/\square$ (ohm per square).

The surface of the anode may be subjected to UV/ozone cleaning or plasma cleaning.

For inhibiting short circuits of the organic EL element and occurrence of defects, the surface roughness may be controlled to be equal to or less than 20 nm as a root mean square value by a method of reducing the particle diameter or a method of polishing after forming a film.

(Cathode)

The cathode is an electrode for injecting electrons into the organic layer 20 (electron injection transport layer in the layer structure described above).

To increase the efficiency of the electron injection, a metal, an alloy, an electrically conductive compound, or a mixture thereof having a work function that is, for example, less than 4.5 eV, generally equal to or less than 4.0 eV, typically equal to or less than 3.7 eV, is used as a material for forming the cathode.

Electrode materials for forming the cathode include, for example, lithium, sodium, magnesium, gold, silver, copper, aluminum, indium, calcium, tin, ruthenium, titanium, manganese, chrome, yttrium, aluminum-calcium alloys, aluminum-lithium alloys, aluminum-magnesium alloys, magnesium-silver alloys, magnesium-indium alloys, lithium-indium alloys, sodium-potassium alloys, magnesium/copper mixtures and aluminum/aluminum oxide mixtures. A material that can be employed as a material for forming the anode may also be used for the cathode.

When the back electrode 30 is a cathode, a material having a function of reflecting light to be extracted to outside is preferably selected among the materials described above, and in general, a metal, an alloy or a metallic compound is selected.

When the transparent electrode 10 is a cathode, a setting is generally made so that the transmittance for light to be extracted becomes greater than 10%, and for example, an electrode formed by laminating a transparent conductive oxide to a very thin magnesium-silver alloy, or the like, is employed. In the cathode, a buffer layer containing copper phthalocyanine or the like is preferably provided between the cathode and the organic layer 20 to prevent the light-emitting layer and other components from being damaged by plasma when sputtering the conductive oxide.

The cathode may be made of single material or several materials described above. For example, if 5% to 10% of silver or copper is added to magnesium, the cathode is prevented from being oxidized and the adhesiveness between the cathode and the organic layer 20 is improved.

The cathode may have a multi-layered structure comprising multiple layers of the same composition or different compositions. For example, the cathode may have the following structure.

To prevent oxidation of the cathode, a protective layer made of corrosion-resistant metal is provided at part of the cathode that does not contact the organic layer 20.

As material for forming the protective layer, for example, silver or aluminum is preferably used.

An oxide, a fluoride, or a metallic compound having a small work function is inserted in the boundary portion between the cathode and the organic layer 20 to reduce the work function of the cathode.

For example, the material of the cathode is aluminum, and lithium fluoride or lithium oxide is inserted in the boundary portion.

The cathode is formed by a known film formation process such as a vacuum deposition process, a sputtering process, an ionization deposition process, an ion plating process, and an electron beam evaporation process.

The sheet electric resistance of the cathode is preferably set to several hundreds $\Omega/\square$ or less.

Next, layers and members that are preferably employed in the organic EL element 1 will be described.

(Insulating Layer)

An insulating layer is preferably provided on the outer periphery of the organic layer 20 to prevent the transparent electrode 10 and the back electrode 30 from being short-circuited. By providing the insulating layer, the transparent electrode 10 and the back electrode 30 in electrically adjacent light emitting regions can also be prevented from contacting the organic layer 20.

As material for forming the insulating layer, a material for forming the insulating layer, which is employed in a known organic EL element, may appropriately be employed, and for example, the above described materials for forming the insulating portions 40 may be employed. As a method for forming the insulating layer, a known formation method may be employed, and for example, a sputtering process, an electron beam deposition process, a CVD process or the like may be employed.

(Auxiliary Electrode)

An auxiliary electrode can be provided as a matter of course. The auxiliary electrode is electrically connected to the anode and/or cathode. The auxiliary electrode is made of material having the volume resistivity that is lower than that of the electrode to which the auxiliary electrode is connected. If the auxiliary electrode is made of such material, the volume resistivity of the entire electrode provided with the auxiliary electrode can be decreased, thus making it possible to reduce the maximum difference of the level of current that flows through each point forming the organic layer 20 as compared to a case where the auxiliary electrode is not provided.

Materials for forming the auxiliary electrode may include, for example, tungsten (W), aluminum (Al), copper (Cu), silver (Ag), molybdenum (Mo), tantalum (Ta), gold (Au), chrome (Cr), titanium (Ti), neodymium (Nd), and alloys thereof. Specific examples of the alloys may include Mo—W, Ta—W, Ta—Mo, Al—Ta, Al—Ti, Al—Nd, and Al—Zr alloys. Further, as material for forming an auxiliary wiring layer, compounds of metal and silicon, which are $TiSi_2$, $ZrSi_2$, $HfSi_2$, $VSi_2$, $NbSi_2$, $TaSi_2$, $CrSi_2$, $WSi_2$, $CoSi_2$, $NiSi_2$, $PtSi$, $Pd_2Si$ and the like are preferable. The auxiliary wiring layer may be formed by laminating the metal and silicon compounds.

The auxiliary electrode may be a single layer film made of the above described material, but is also preferably a multi-layered film including two or more layers for improving the stability of the film. Such a multilayered film may be formed using the above described metals and alloys thereof. For example, combinations of a Ta layer, a Cu layer and a Ta layer, and a Ta layer, an Al layer and a Ta layer may be used for the three-layer film, and combinations of an Al layer and a Ta layer, a Cr layer and an Au layer, a Cr layer and an Al layer, and an Al layer and a Mo layer may be used for the two-layer film.

The stability of a film means a property that allows a low volume resistivity to be maintained and makes the film resistant to corrosion by a liquid or the like that is used in processing such as etching. For example, if the auxiliary electrode is made of Cu or Ag, the auxiliary electrode may be prone to corrosion although its volume resistivity is low. By laminating a film made of metal excellent in corrosion resistance, for example Ta, Cr or Mo, to the topside and the underside, or one of the sides, of the metallic film made of Cu or Ag as a counter measure, the stability of the auxiliary electrode can be improved.

In general, the thickness of the auxiliary electrode is preferably in a range of 100 nm to several tens of μm, and particularly preferably within the range of 200 nm to 5 μm.

The reason for this is that if the thickness is less than 100 nm, the resistance value is increased, which is not preferable for the auxiliary electrode, and on the other hand, if the thickness exceeds several tens of μm, planarization of the auxiliary electrode becomes difficult, thus raising the possibility of occurrence of defects in the organic EL element 1.

The width of the auxiliary electrode is preferably within the range of 2 μm to 1,000 μm, and more preferably within the range of 5 μm to 300 μm.

The reason for this is that if the width is less than 2 μm, the resistance of the auxiliary electrode might be increased, and on the other hand, if the width exceeds 1000 μm, the auxiliary electrode might hinder light from being extracted to outside.

(Protective Layer: Passivation Film and Sealing Can)

For protecting the organic layer 20 and the like from outside air, the organic EL element 1 may be protected with a passivation film or a sealing can.

The passivation film is a protective layer (sealing layer) that is provided on a side opposite to the transparent substrate 9 for preventing the organic EL element 1 from contacting oxygen and water. Materials that are used for the passivation film may include, for example, organic polymeric materials, inorganic materials and further, photocurable resins. The material that is used for the protective layer may be a single material or a combination of two or more materials. The passivation film may have any thickness as long as water or gas from outside can be blocked.

Examples of the organic polymer material may include fluorocarbon resins such as chlorotrifluoroethylene polymers, dichlorodifluoroethylene polymers, and copolymers of chlorotrifluoroethylene polymer and dichlorodifluoroethylene polymer, acrylic resins such as polymethyl methacrylate and polyacrylate, epoxy resins, silicon resins, epoxy silicone resins, polystyrene resins, polyester resins, polycarbonate resins, polyamide resins, polyimide resins, polyamide-imide resins, polyparaxylene resins, polyethylene resins, and polyphenylene oxide resins.

Examples of the inorganic material may include polysilazane, diamond films, amorphous silica, electrical insulation glass, metal oxides, metal nitrides, metal carbides and metal sulfides.

The sealing can is a member constituted by a sealing member such as a sealing plate and a sealing container for blocking water and oxygen from outside. The sealing can may be provided only on the electrode side on the back side (side opposite to the transparent substrate 9), and the entire organic EL element 1 may be covered with the sealing can. The shape, the size, the thickness and the like of the sealing member are not specifically limited as long as the sealing member can seal the organic EL element 1 and block outside air. Materials that are used as the sealing member may include glass, stainless steels, metals (aluminum and the like), plastics (polychlorotrifluoroethylene, polyester, polycarbonate and the like), ceramics and the like.

A sealant (adhesive) may appropriately be used when the sealing member is placed on the organic EL element 1. When the entire organic EL element 1 is covered with the sealing member, the sealing member is heat-sealed without using a sealant. As the sealant, an ultraviolet cured resin, a thermosetting resin, a two liquid cured thermosetting resin or the like may be used.

A moisture absorbent may be inserted in a space between the passivation film or sealing can and the organic EL element 1. The moisture absorbent is not specifically limited, and specific examples of the moisture absorbent include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, magnesium oxide and the like.

An inactive gas may be included in the passivation film or the sealing can. The inactive gas refers to a gas that does not react with the organic EL element 1, and for example, noble gases such as helium and argon, and nitrogen gas may be employed.

The substrate will now be described.

<Substrate>

The substrate is principally a flat member that supports the organic EL element 1. The organic EL element 1 is constituted by very thin layers, and is therefore fabricated as an organic EL apparatus supported on the substrate in general.

The substrate is a member to which the organic EL element 1 is laminated, and therefore the substrate preferably has plane smoothness.

The substrate is transparent to light to be extracted when the substrate is situated on the light extraction side from the organic layer 20. Since the organic EL element 1 of this embodiment is a bottom emission type element, the substrate is transparent, and a flat surface of the transparent substrate 9 opposite to a flat surface contacting the organic EL element 1 is a light extraction surface 90.

For the substrate, known members may be used as long as the members have the aforementioned function. In general, a ceramics substrate, such as a glass substrate, a silicon substrate, and a quartz substrate, or a plastic substrate is selected. A metal substrate or a substrate made by forming a metal foil on a support is used. Further, a substrate formed of a compound sheet, in which the same type or different types of substrates are combined, may be used.

In the above example, the bottom emission type organic EL apparatus having the transparent electrode 10, the organic layer 20 and the back electrode 30 formed in order on the transparent substrate 9 is shown, but of course, the organic EL element may be constructed as the organic EL element 1 having no transparent substrate 9 rather than constructing the organic EL element as the organic EL apparatus. In this case, the organic EL element 1 may be manufactured without using the substrate from the initial stage, or the organic EL element 1 may be manufactured by removing the substrate by a known substrate removal technique such as etching after fabricating the organic EL apparatus.

The organic EL element may be constructed as a top emission type apparatus or an apparatus in which light is extracted from both sides as described previously.

That is, for manufacturing the bottom emission type organic EL element 1, the transparent electrode 10, the organic layer 20 and the back electrode 30 may be formed on the transparent substrate 9 using the aforementioned film formation process. For manufacturing the top emission type organic EL element, the back electrode 30, the organic layer 20 and the transparent electrode 10 may be formed in order on the substrate.

The operation and the advantages of the organic EL element 1 will now be described.

<Operation and Advantages>

The transparent electrode 10 and the back electrode 30 in the organic EL element 1 are connected to an external drive circuit at their terminal portions 11 and 31. When a voltage is applied to the organic EL element by the external drive circuit, a voltage is applied to the organic layer. At this time, the light emitting portion 21 emits light, and the non-light emitting portions 22 do not emit light.

As described previously, the non-light emitting portions 22 occupy larger area per unit area at a position closer to the terminal portion 11 of an electrode having a higher volume resistivity (in this example, transparent electrode 10). The current density in the light emitting portion 21 is higher at a position closer to the terminal portion 11. Thus, in unit area sufficiently larger than the area of one of the non-light emitting portions 22 of the organic layer 20, the amount of current passing through the organic layer 20 can be almost equalized according to the distance from the terminal portion 11.

The operations and advantages described in the explanations described previously can be obtained as a matter of course.

Figure 5:
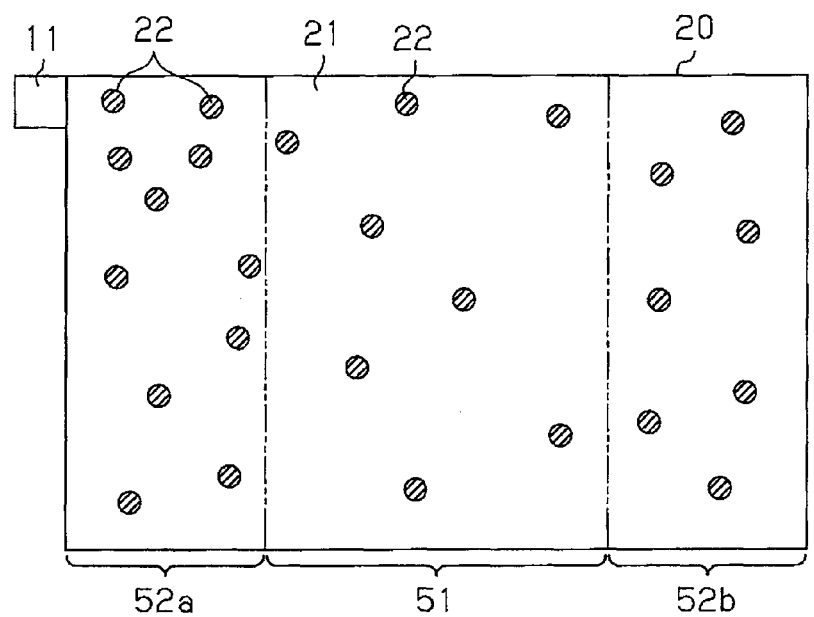
FIG. 5 is a schematic front view for explaining the organic layer provided on the organic EL element in another embodiment of the present invention.
Figure 6:
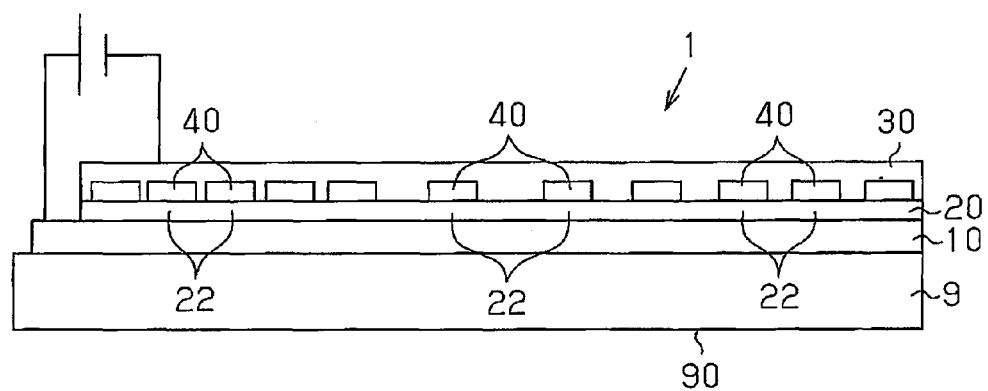
FIG. 6 is a schematic cross-sectional view of the organic EL apparatus comprising the organic EL element shown in FIG. 5.

An embodiment in which the present invention is implemented as an organic EL element of which the central part has a luminance higher than the luminance on both sides as a desired state of the luminance distribution of the organic EL element will now be described with reference to FIGS. 5 and 6. The same reference numerals are given to those components that are like or the same as the corresponding components of the previous embodiments and detailed explanations are omitted. FIG. 5 is a schematic front view showing a relationship between the organic layer 20 and the non-light emitting portions 22, and FIG. 6 is a schematic cross-sectional view of the organic EL apparatus. In FIG. 6, the hatching for showing the cross section is omitted.

As shown in FIG. 6, the organic EL apparatus has the transparent electrode 10, the organic layer 20 and the back electrode 30 formed in order on the transparent substrate 9. On the surface of the organic layer 20 corresponding to the back electrode 30, the insulating portions 40 are provided at a plurality of locations, and areas of the organic layer 20 corresponding to the insulating portions 40 form the non-light emitting portions 22. That is, the organic layer 20 has as many non-light emitting portions 22 as the insulating portions 40.

The organic EL element 1 is protected with a passivation film (not shown) except for the surface facing the transparent substrate 9.

The terminal portion 11 of the transparent electrode 10 is provided at a corner on one end side of the transparent electrode 10 as in the previous embodiments. Thus, when a voltage is applied between the transparent electrode 10 and the back electrode 30 with no non-light emitting portions 22 provided on the organic layer 20, the luminance is higher in a region physically closer to the terminal portion 11.

The luminance distribution is adjusted so that a predetermined region 51 at the central part of the organic EL element 1 has a luminance higher than the luminance of regions 52a and 52b on both sides by providing the non-light emitting portions 22. Specifically, a plurality of non-light emitting portions 22 are provided, and the non-light emitting portions 22 are provided so that the area occupied by the non-light emitting portions 22 per unit area in a region where the rate at which the luminance of the organic layer 20 when emitting light is to be reduced compared to the luminance when the non-light emitting portions 22 are not provided is greater.

In a state of emitting light before providing the non-light emitting portions 22, the luminance is higher in a region closer to the terminal portion 11. Thus, for making the predetermined region 51 at the central part have a luminance higher than the luminance of the regions 52a and 52b on both sides, the non-light emitting portions 22 are provided so that in the region 52a close to the terminal portion 11, the proportion of the non-light emitting portions 22 is higher than that in the predetermined region 51 at the central part. The non-light emitting portions 22 are provided so that in the predetermined region 51 at the central part, the proportion of the non-light emitting portions 22 distributed is higher on a side close to the terminal portion 11 than on a side distant from the terminal portion 11. In the region 52b distant from the terminal portion 11, the proportion of the non-light emitting portions 22 distributed is higher on a side close to the region 51 than in the part of the adjacent region 51, but becomes lower as departing from the region 51, and therefore the proportion of the non-light emitting portions 22 distributed in a part distant from the region 51 is lower than the proportion of the non-light emitting portions 22 distributed in the region 51 in some cases.

In this embodiment, for the configuration of components such as the organic layer 20, the light emitting portion 21, the non-light emitting portions 22, the transparent electrode 10 and the back electrode 30 constituting the organic EL element 1, various configurations can be employed as in the previous embodiments. The substrate, the insulating layer, the auxiliary electrode, the protective layer (passivation film and sealing can) and the like can have various configurations as in the pervious embodiments.

In this embodiment, the transparent electrode 10 and the back electrode 30 in the organic EL element 1 are connected to the external drive circuit via their terminal portions 11 and 31. When a voltage is applied to the organic EL element 1 by the external drive circuit, a voltage is applied to the organic layer 20. At this time, the light emitting portion 21 emits light, and the non-light emitting portions 22 do not emit light. Since the non-light emitting portions 22 are provided in the form of distribution described above, light is emitted so that the predetermined region 51 at the central part of the element has a luminance higher than the luminance of the regions 52a and 52b on both sides.

In this embodiment, operations and advantages based on the configuration in the previous embodiments can be obtained as a matter of course so far as parts of the same configuration are concerned. For example, by forming the insulating portions 40 with material having a high reflectivity, power consumption required for obtaining the same luminance can be reduced.

Another embodiment in which the non-light emitting portions 22 are formed by the insulating portions 40 to implement the present invention as an organic EL element, wherein the predetermined region of the central part of the organic EL element 1 has a luminance higher than the luminance of the regions on both sides, will now be described with reference to FIGS. 7 and 8. The same reference numerals are given to those components that are like or the same as the corresponding components of the previous embodiments and detailed explanations are omitted.

Figure 7:
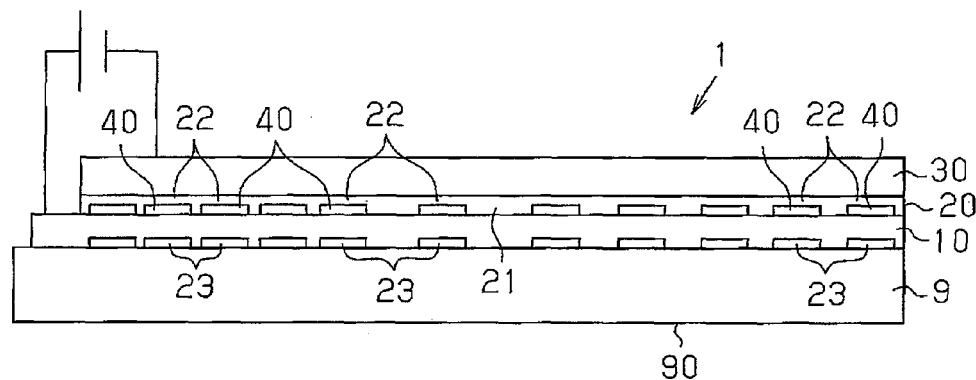
FIG. 7 is a schematic cross-sectional view of the organic EL apparatus comprising the organic EL element in another embodiment.

As shown in FIG. 7, this embodiment is different from the previous embodiments in that insulating portions 40 are provided between the transparent electrode 10 (anode) and the organic layer 20, and light reflecting layers 23 is provided at positions corresponding to the insulating portions 40 between the transparent substrate 9 and the transparent electrode 10, and other aspects are the same.

In the previous embodiments, the insulating portions 40 are provided between the organic layer 20 and the back electrode 30, and therefore it is necessary to form the insulating portions 40 after forming the organic layer 20. It is necessary to form the insulating portions 40 to have a predetermined distribution, namely the insulating portion 40 is not formed as a flat surface on the organic layer 20, but pattern formation is required. The organic layer 20 is sensitive to water and high heat, and therefore in a method of removing unnecessary areas by etching and forming the insulating portions 40 on necessary areas, manufacturing conditions for preventing the organic layer 20 from being damaged is strict.

However, in this embodiment, the insulating portions 40 are provided between the transparent electrode 10 and the organic layer 20, and therefore the organic layer 20 can be formed after forming the insulating portions 40, thus improving the degree of freedom when forming the insulating portions 40. For example, the insulating portions 40 are made of positive type photoresist and the insulating portions 40 having a predetermined distribution (pattern) are formed. It is not necessary to provide a mask for exposing areas other than areas forming the insulating portions 40 when exposing the photoresist because the transparent substrate 9 on which the light reflecting layers 23 are formed serves as a mask.

Figure 8A:
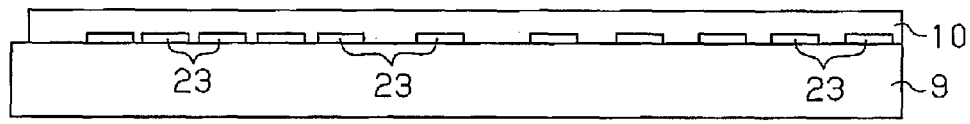
FIGS. 8(a) to 8(c) are schematic diagrams showing a step of forming the same organic EL element.
Figure 8B:
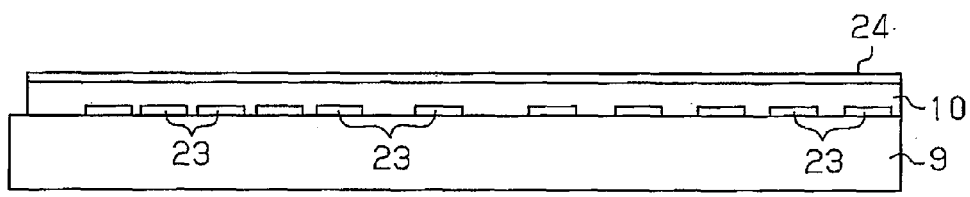
Figure 8C:
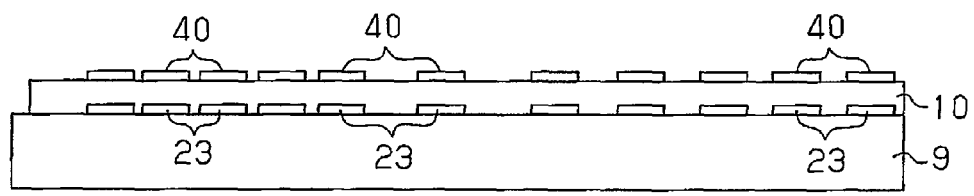

Specifically, in a step of forming the organic EL element 1 on the transparent substrate 9, the light reflecting layers 23 at predetermined positions (positions corresponding to positions at which insulating portions 40 are formed) on the transparent substrate 9, and then the transparent electrode 10 is formed thereon as shown in FIG. 8(a). The light reflecting layers 23 are made of, for example, silver. Then, a photoresist layer 24 is formed on the transparent electrode 10, and then exposed from the side corresponding to the transparent substrate 9 as shown in FIG. 8(b), whereby areas other than areas corresponding to the light reflecting layers 23 on the photoresist layer 24 become soluble. Then, the soluble areas are removed, and the insulating portions 40 are formed on the area corresponding to the light reflecting layers 23 as shown in FIG. 8(c). Subsequently, the organic layer 20, the back electrode 30 and the protective layer (not shown) are formed to form the organic EL apparatus. In FIG. 7, the organic layer 20 seems thicker than the insulating portions 40 for the sake of convenience, but in fact, the insulating portions 40 are thicker.

In this embodiment, the organic EL element 1 emits light so that the predetermined region 51 at the central part of the element has a luminance higher than the luminance of the regions 52a and 52b when a voltage is applied to the organic EL element 1 as in the previous embodiments. In this embodiment, since the insulating portions 40 determining a luminance distribution are made of photoresist, and the transparent substrate 9 on which the light reflecting layers 23 are formed serves as a mask that is used when the insulating portions 40 are exposed, the insulating portions 40 are accurately formed at a position as designed. For obtaining a luminance distribution as designed, it is easier to design the organic EL element 1 so that light does not exit from the position corresponding to the insulating portion 40, namely the locations corresponding to the non-light emitting portions 22. In this embodiment, the light reflecting layers 23 are formed at the position corresponding to the insulating portions 40, and therefore even if the insulating portions 40 allow part of light to pass therethrough, the light reflecting layers 23 hinder the light from exiting from the transparent substrate 9, and a luminance distribution as designed is easily obtained. In each non-light emitting portion 22, light traveling to the inside of the organic EL element 1 from the light extraction surface 90 of the transparent substrate 9 is reflected at the light reflecting layers 23. Accordingly, for example, if the organic layer and the transparent electrode have a function of absorbing light, light does not pass through these layers absorbing light, but is reflected at the light reflecting layers 23, and therefore the optical loss decreases as compared to the previous embodiments.

Figure 9:
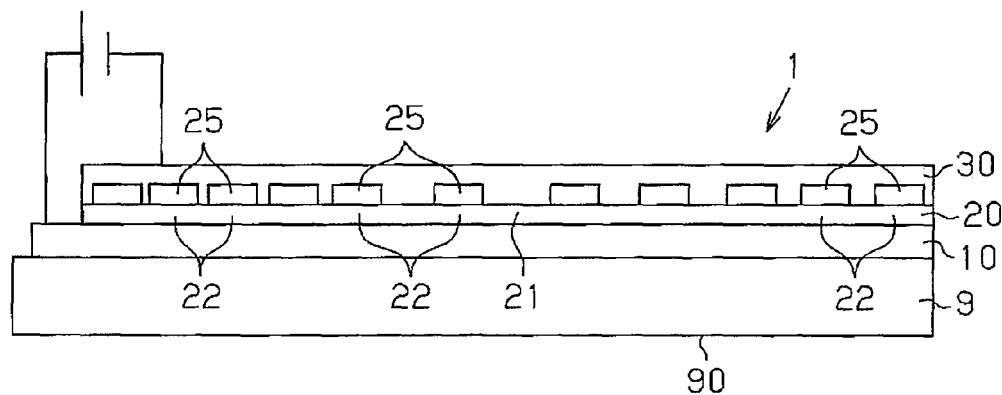
FIG. 9 is a schematic cross-sectional view of the organic EL apparatus comprising the organic EL element in another embodiment.

Another embodiment in which the present invention is implemented as an organic EL element of which the predetermined region at the central part of the organic EL element has a luminance higher than the luminance of the regions on both sides as a desired state of the luminance distribution of the organic EL element will be described with reference to FIG. 9. The same reference numerals are given to those components that are like or the same as the corresponding components of the previous embodiments and detailed explanations are omitted.

This embodiment is different from the previous embodiments in that the cathode (back electrode 30) which is an electrode situated on a side opposite to the anode (transparent electrode 10) with the organic layer 20 held therebetween has on a side opposite to the organic layer 20 a plurality of parts 25 made of material having a work function larger than that of the material of the electrode, and other aspects are the same. The areas on the organic layer 20 corresponding to the aforementioned parts 25 form the non-light emitting portions 22. That is, the organic layer 20 has as many non-light emitting portions 22 as the parts 25. The parts 25 are provided so that the area occupied by the parts 25 per unit area is greater in a region where a rate at which the luminance of the organic layer 20 when emitting light is reduced compared to the luminance when the parts 25 are not provided.

The back electrode 30 is made of, for example, aluminum, and the parts 25 are made of, for example, silver. Silver has a reflectivity greater than that of aluminum, and therefore in this case, the parts 25 have a reflectivity greater than that of the back electrode 30. The parts 25 are provided in place of the insulating portions 40 which are provided in the pervious embodiments. When the insulating portions 40 are provided as in the previous embodiments, current does not pass through the organic layer 20 on the corresponding area even when a voltage is applied between the transparent electrode 10 and the back electrode 30, and the area becomes the non-light emitting portions 22.

In this embodiment, the parts 25 made of material having a work function larger than that of the material of the cathode (back electrode 30) exist between the organic layer 20 and the cathode (back electrode 30) in place of the insulating portions 40. Unlike the insulating portions 40, the parts 25 are made of conductive material rather than insulating material, and therefore allows current to easily pass therethrough. However, the organic layer 20 is essentially an insulating material, and when a voltage is applied between the anode and the cathode when materials having different work functions contact the organic layer 20 on the cathode side, electrons can be injected only in a material having a smaller work function if the applied voltage does not reach a minimum voltage allowing electrons to be injected in a material having a larger work function. Thus, in this state, current does not pass through the organic layer 20 on the area corresponding to the material having a larger work function, and the area becomes the non-light emitting portions 22.

That is, when a voltage allowing electrons to be injected only in the material having a smaller work function (material of the back electrode 30) is applied between the transparent electrode 10 and the back electrode 30, the parts 25 made of material having a work function larger than that of the material of the back electrode 30 cannot allow current to pass toward the transparent electrode 10, and thus functions as the insulating portion does.

Thus, if the parts 25 are so provided as to give a distribution same as the distribution of the insulating portions 40 in the organic EL element 1 of the embodiment in which the insulating portions 40 are provided, the organic EL element 1 which emits light with the predetermined region 51 at the central part having a luminance higher than the luminance of the regions 52a and 52b on both sides can be obtained as in the previous embodiments. The size and the number of parts 25 to be provided on the predetermined region 51 and the regions 52a and 52b are set according to values of luminances to be obtained in the predetermined region 51 and the regions 52a and 52b. Since the level of the work function varies depending on the material, there may be cases where a different material should be selected as the material for forming the parts 25 if the material for forming the back electrode 30 is changed.

In this embodiment, advantages same as those of the previous embodiments in which the insulating portions 40 are provided can be obtained, and in addition, the following advantage can be obtained. That is, when the organic EL element 1 is used as a backlight comprising a brightness enhancement film (BEF), reflected-back light is generated by the brightness enhancement film, and therefore in this embodiment, the reflected-back light can efficiently be reflected toward the transparent electrode 10 because the parts 25 are made of material having a reflectivity higher than that of the back electrode 30. As a result, power consumption can be reduced.

Figure 10:
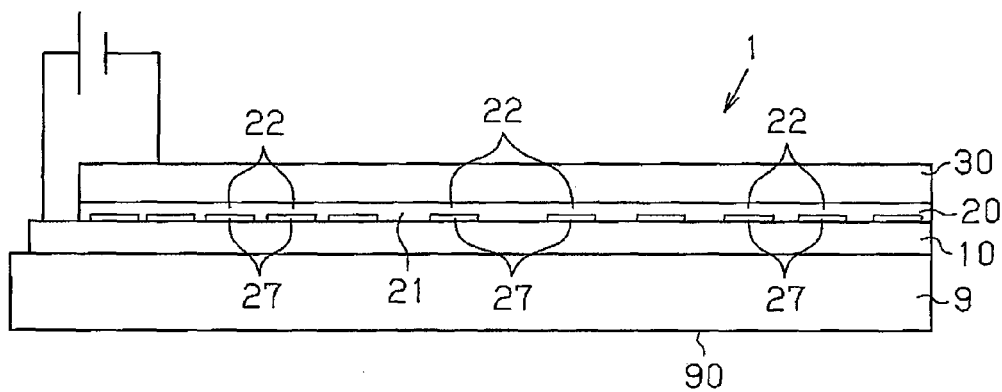
FIG. 10 is a schematic cross-sectional view of the organic EL apparatus comprising the organic EL element in another embodiment.

As a configuration in which the non-light emitting portions 22 are formed using conductive material, parts made of material having a work function smaller than that of the anode may be provided between the anode (transparent electrode 10) and the organic layer 20 instead of providing parts made of material having a work function larger than that of the cathode. For example, as shown in FIG. 10, a plurality of parts 27 made of material having a work function smaller than that of the material of the anode are provided between the area between the transparent electrode 10 and the organic layer 20 corresponding to the area of the organic layer 20 on which the non-light emitting portions 22 should be formed.

If the transparent electrode 10 is made of ITO, a metal having a work function smaller than the work function of ITO, i.e. 4.5 to 4.8 eV, is used as material of the parts 27. As the metal, for example, aluminum is used.

In this case, the parts 27 are provided in place of the insulating portions 40. If the insulating portions 40 are provided as in the previous embodiments, current does not pass through the organic layer 20 on the corresponding area even when a voltage is applied between the transparent electrode 10 and the back electrode 30, and the area becomes the non-light emitting portions 22.

In this embodiment, the parts 27 made of material having a work function smaller than that of the material of the anode (transparent electrode 10) exist between the organic layer 20 and the anode (transparent electrode 10) in place of the insulating portions 40. Unlike the insulating portions 40, the parts 27 are made of conductive material rather than insulating material and therefore allows current to easily pass therethrough. However, the organic layer 20 is essentially an insulating material, and current passes through a region on the anode side where holes are injected in the organic layer 20. When a voltage is applied to between the anode and the cathode, holes are more easily injected in the anode made of material having a large work function, and holes are injected at a lower voltage as compared to a material having a small work function. Thus, when a voltage is applied between the anode and the cathode when materials having different work functions contact the organic layer 20 on the anode side, holes can be injected only in a material having a larger work function if the applied voltage does not reach a level of voltage allowing holes to be injected in a material having a smaller work function. In this state, current does not pass through the organic layer 20 on the area corresponding to the material having a larger work function, and the area becomes the non-light emitting portions 22.

Thus, in this embodiment, the organic EL element 1 of which the predetermined region 51 at the central part has a luminance higher than the luminance of the regions 52*a* and 52*b* on both sides can be obtained as in the previous embodiments if the parts 27 are so provided as to give a distribution same as the distribution of the insulating portions 40 in the organic EL element 1 of the embodiment in which the insulating portions 40 are provided.

The conductive material for forming the parts 27 has a resistance lower than that of ITO, and therefore by providing the parts 27, the resistance of the transparent electrode 10 in the plane direction decreases as a whole, and when the same voltage is applied between the transparent electrode 10 and the back electrode 30, the amount of current passing increases, thus making it possible to enhance the luminance of the entire organic EL element 1.

Figure 11:
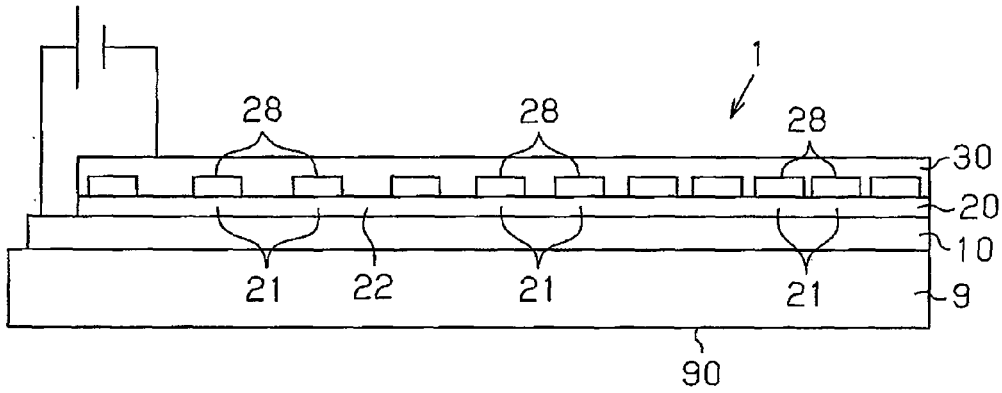
FIG. 11 is a schematic cross-sectional view of the organic EL apparatus comprising the organic EL element in another embodiment.

An embodiment where the luminance is made substantially uniform throughout the organic EL element 1 will now be described. As shown in FIG. 11, the organic EL apparatus has the transparent electrode 10 (anode), the organic layer 20 and the back electrode 30 (cathode) formed in order on the transparent substrate 9. Electron injection layers 28 are provided at a plurality of locations on the surface of the back electrode 30 corresponding to the organic layer 20, areas on the organic layer 20 corresponding to the electron injection layers 28 form the light emitting portions 21. That is, the organic layer 20 has as many light emitting portions 21 as the electron injection layers 28. The organic EL element 1 is protected with a passivation film (not shown) except for the surface facing the transparent substrate 9.

The electron injection layers 28 are made of material having a work function smaller than that of the material of the back electrode 30. As a combination of materials of the back electrode 30 and the electron injection layers 28, for example, a combination of silver as the material of the back electrode 30 and lithium or cesium as the material of the electron injection layers 28, or a combination of aluminum as the material of the back electrode 30 and fluorinated lithium as the material of the electron injection layers 28 is preferable. In this embodiment, the back electrode 30 (cathode) is made of silver, and the electron injection layers 28 are made of lithium or cesium. Thus, when a voltage allowing electrons to be injected only in the electron injection layers 28 is applied between the anode and the cathode, current passes through the organic layer 20 from the electron injection layers 28, so that the areas on the organic layer 20 become the light emitting portions 21. In the area where the back electrode 30 contacts the organic layer 20, current does not pass through the organic layer 20, and therefore the area becomes the non-light emitting portion 22.

Since the luminance of the light emitting portion 21 is higher at a position closer to the terminal portion 11, the number and the size of the electron injection layers 28 are set so that the area occupied by the electron injection layers 28 per unit area is greater at a position more distant from the terminal portion 11 for making the luminance substantially uniform throughout the organic EL element 1.

The organic EL apparatus is used in a state in which a voltage allowing electrons to be injected only in the electron injection layers 28 is applied between the anode and the cathode. In this state, the areas corresponding to the electron injection layers 28 are the light emitting portions 21, the light emitting portions 21 emit light in the distribution described above, and therefore the organic EL element 1 emits light with substantially a uniform luminance as a whole.

Since silver that is a material having a high reflectivity is used as the cathode, the rate at which part of light emitted at the light emitting portions 21 and traveling to the back electrode 30 is reflected at the back electrode 30 and exits by way of the side corresponding to transparent electrode 10 becomes higher. As a result, power consumption can further be reduced when the luminance is the same as a whole.

Figure 12:
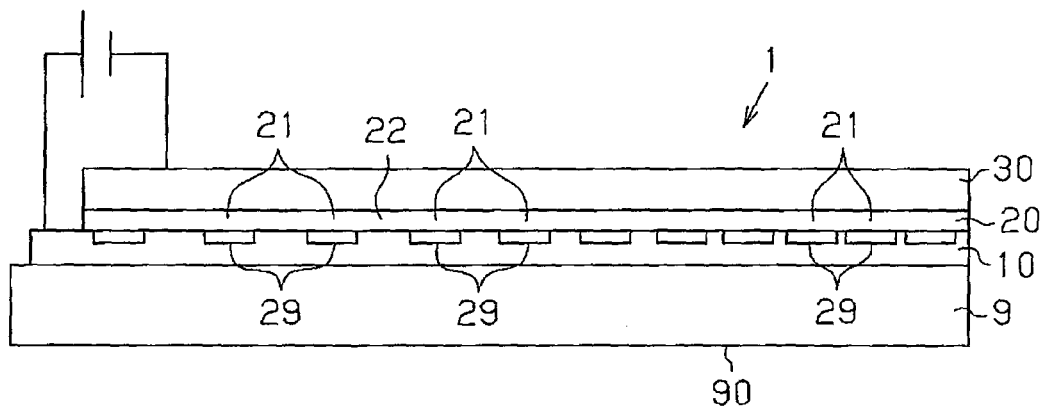
FIG. 12 is a schematic cross-sectional view of the organic EL apparatus comprising the organic EL element in another embodiment.

Another embodiment will now be described. In the preceding embodiment, the electron injection layers 28 are provided at a plurality of locations on the surface of the back electrode 30 corresponding to the organic layer 20, and a level of voltage allowing electrons to be injected only in the electron injection layers 28 is applied between the anode and the cathode. In this embodiment, the electron injection layers 28 are not provided, but as shown in FIG. 12, parts 29 corresponding to locations on the transparent electrode 10 forming the anode, on a side opposite to the organic layer 20, where the electron injection layers 28 are provided in the previous embodiments, are made to have a large work function. The transparent electrode 10 is made of ITO, and the parts 29 are formed by ultraviolet irradiation or plasma treatment. For example, after the transparent electrode 10 is formed on the transparent substrate 9, predetermined areas on the transparent electrode 10 are subjected to ultraviolet irradiation or plasma irradiation using a mask, whereby the parts 29 are formed.

Each part 29 is modified to have a work function larger than that of the material of the transparent electrode 10. Thus, when a voltage which allows injection of holes to the organic layer 20 only at the location where the organic layer 20 contacts each part 29 but does not allow injection of holes at the location where ITO, i.e. material of the transparent electrode 10, contacts the organic layer 20 is applied between the anode and the cathode, current passes through the organic layer 20 from each part 29, so that the locations where the organic layer 20 contact the parts 29 become the light emitting portions 21. In the area where ITO contacts the organic layer 20, injection of holes is not carried out, current does not pass through the organic layer 20, and therefore the area becomes the non-light emitting portion 22.

The luminance of the light emitting portions 21 corresponding to the parts 29 is higher than the luminance when the organic layer 20 emits light in a state in which the parts 29 are not provided but the transparent electrode 10 having an area equal to that of each part 29 is provided. Thus, the luminance of the light emitting portions 21 is higher at a position closer to the terminal portion 11 with the same level of power consumption, the number and the size of the parts 29 are set so that the area occupied by the parts 29 per unit area is greater at a position more distant from the terminal portion 11 for making the luminance substantially uniform throughout the organic EL element 1.

The organic EL apparatus is used in a state in which a voltage allowing holes to be injected only from each part 29 is applied between the anode and the cathode. In this state, the organic layer 20 on the areas corresponding to each part 29 becomes the light emitting portions 21, the parts 29 have the distribution described above, and therefore the organic EL element 1 emits light with substantially a uniform luminance as a whole.

In this embodiment, the luminance of the light emitting portions 21 is higher as compared to a case where the parts 29 are not provided, and the organic layer 20 emits light as a voltage is applied between the anode and the cathode. Thus, the organic EL element 1 can enhance the luminance at a desired position with the same level of power consumption, and power consumption can be reduced when the luminance is the same.

In the embodiment in which the present invention is implemented as an organic EL element having a luminance substantially uniform throughout the element as a desired state of the luminance distribution of the organic EL element, the parts 25 made of material having a work function larger than that of the material for forming the cathode may be provided between the cathode and the organic layer 20, instead of the configuration in which the insulating portions 40 are provided to form the non-light emitting portions 22. The aforementioned parts 25 are provided so that the area occupied by the parts 25 is greater at a position physically closer to the position of a terminal portion at which an electrode made of material of which the aforementioned volume resistivity is higher is connected to an external connection terminal. In the organic EL element, a level of voltage allowing electrons to be injected only from the aforementioned parts 25 is applied between the anode and the cathode when the organic EL element is used.

In the embodiment in which the present invention is implemented as an organic EL element having a luminance substantially uniform throughout the element as a desired state of the luminance distribution of the organic EL element, the parts 27 made of material having a work function smaller than that of the material for forming the anode may be provided between the anode and the organic layer 20, instead of the configuration in which the insulating portions 40 are provided to form the non-light emitting portions 22. The aforementioned parts 27 are provided so that the area occupied by the parts is greater at a position physically closer to the position of a terminal portion at which an electrode made of material of which the aforementioned volume resistivity is higher is connected to an external connection terminal. In the organic EL element, a level of voltage allowing holes to be injected only from the aforementioned parts 25 is applied between the anode and the cathode when the organic EL element is used.

In an organic EL element other than the organic El element having a luminance substantially uniform throughout the element as a desired state of the luminance distribution of the organic EL element, for example an organic EL element in which the luminance at the central part of the element is high, a configuration in which the luminance of the light emitting portion 21 is higher than the luminance when the non-light emitting portions 22 are not provided may be employed. That is, the electron injection layers 28 are provided in the area between the cathode (back electrode 30) and the organic layer 20 corresponding to the location at which the light emitting portion 21 should be situated, or a predetermined area of the anode (transparent electrode 10) corresponding to the location on the organic layer at which the light emitting portion 21 should be situated is modified to have a work function larger than the work function of other areas. In these cases, the luminance at a desired position on the organic EL element 1 can be enhanced with the same level of power consumption, and power consumption can be reduced when the luminance is the same.

Figure 13:
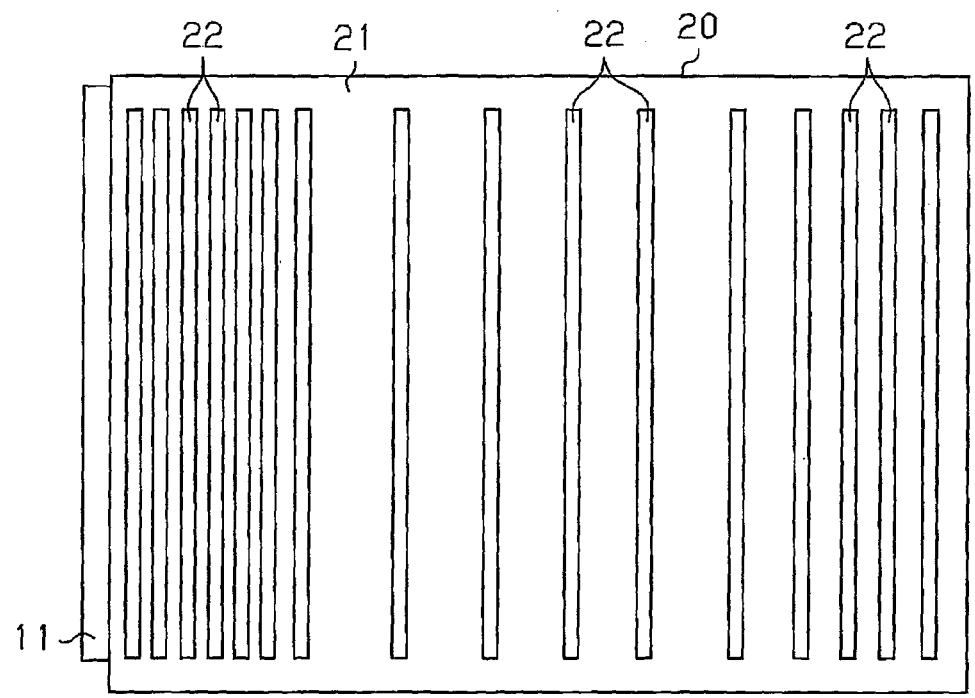
FIG. 13 is a schematic front view showing the layout of the non-light emitting portion in another embodiment.

Instead of positioning the terminal portion 11 at one corner of the transparent electrode 10, the terminal portion 11 may be provided on one side of the transparent electrode 10 in such a manner as to extend along one edge of the transparent electrode 10, with each non-light emitting portion 22 having a shape of stripe parallel to the terminal portion 11, as shown in FIG. 13. In this configuration, the non-light emitting portions 22 can be formed easily as compared to a case where the non-light emitting portions 22 are formed in a dotted shape. For the method for forming the non-light emitting portions 22, an appropriate method for forming the aforementioned non-light emitting portions 22 is selected such as a method in which the insulating portions 40 are provided, a method in which the parts 25 having a work function larger than that of the cathode is provided between the cathode and the organic layer 20, a method in which the parts 27 having a work function smaller than that of the anode is provided between the anode and the organic layer 20, or the like.

In the embodiment in which the luminance of the light emitting portions 21 is higher than the luminance when the non-light emitting portions 22 is not provided, the aforementioned light emitting portions 21 may have a shape of stripe.

In the embodiments described above, the organic EL element is an element suitable for a lighting system, a backlight or the like, which emits light from the whole surface, but the above described element can be applied for pixels or sub-pixels in an organic EL display employing an active matrix system or a passive matrix system as a matter of course.

The above described organic EL apparatus is a bottom emission type, but the organic EL element may be constructed as a top emission type, or constructed so that light can be extracted from both sides as a matter of course.

In the explanations described above, the transparent electrode is an electrode made of material having a volume resistivity higher than that of the back electrode, but of course, the present invention may be applied to an organic EL element in which the back electrode is made of material having a volume resistivity higher than that of the transparent electrode. In this case, the positions of the non-light emitting portion and the light emitting portion may be specified in reference to the back electrode and the terminal portion in the explanations described above.

The organic layer 20 may have a structure obtained by appropriately selecting from the hole injection layer, the hole transport layer, the light emitting layer, the electron injection layer and the electron transport layer so that at least emission of light is possible and laminating the selected layers. In this case, at least one of the hole injection layer, the hole transport layer, the light emitting layer, the electron injection layer and the electron transport layer is partially prevented from being formed, and areas on which no layer is formed are determined to be non-light emitting portions.

In the explanations described above, an organic EL element is used as an electroluminescence element, but of course, the present invention may be applied to a case where an inorganic EL element is used as an electroluminescence element.

The invention claimed is:

1. An electroluminescence element which emits light at least by application of a voltage to a first electrode and a second electrode, comprising:
    a light emitting portion and a non-light emitting portion, wherein the light emitting portion and the non-light emitting portion are provided for bringing the luminance distribution of the element into a state, wherein the light emitting portion and the non-light emitting portion are provided so that the luminance distribution is uniform as a whole,
    wherein a volume resistivity of the first electrode is higher than that of the second electrode, the first electrode being formed in a flat form, and the non-light emitting portion is provided so that the area occupied by the non-light emitting portion per unit area is greater at a position physically closer to the position of a terminal portion of the first electrode, and
    wherein the non-light emitting portion is constructed by providing a part made of material having a work function larger than that of a material of a cathode of the pair of electrodes between the cathode and the electroluminescence element.

2. The electroluminescence element according to claim 1, wherein the electroluminescence element is an organic electroluminescence element in which at least an organic layer which emits light by application of a voltage is held between the pair of electrodes.

3. The electroluminescence element according to claim 1, wherein the electroluminescence element is an inorganic electroluminescence element.

4. An electroluminescence element which emits light at least by application of a voltage to a first electrode and a second electrode, comprising:
    a light emitting portion and a non-light emitting portion, wherein the light emitting portion and the non-light emitting portion are provided for bringing the luminance distribution of the element into a state, wherein the light emitting portion and the non-light emitting portion are provided so that the luminance distribution is uniform as a whole,
    wherein a volume resistivity of the first electrode is higher than that of the second electrode, the first electrode being formed in a flat form, and the light emitting portion is provided so that the area occupied by the light emitting portion per unit area is greater at a position physically further to the position of the terminal portion of the first electrode, and
    wherein the non-light emitting portion is constructed by providing a part made of material having a work function larger than that of a material of a cathode of the pair of electrodes between the cathode and the electroluminescence element.

5. An electroluminescence element which emits light at least by application of a voltage to a first electrode and a second electrode, comprising:
    a light emitting portion and a non-light emitting portion, wherein the light emitting portion and the non-light emitting portion are provided for bringing the luminance distribution of the element into a state, wherein the light emitting portion and the non-light emitting portion are provided so that the luminance distribution is uniform as a whole,
    wherein a volume resistivity of the first electrode is higher than that of the second electrode, the first electrode being formed in a flat form, and the non-light emitting portion is provided so that the area occupied by the non-light emitting portion per unit area is greater at a position physically closer to the position of a terminal portion of the first electrode,
    wherein the electroluminescence element is an organic electroluminescence element in which at least an organic layer which emits light by application of a voltage is held between the pair of electrodes, and
    wherein the non-light emitting portion is constructed by providing a part made of material having a work function smaller than that of a material of an anode of the pair of electrodes between the anode and the organic layer.

6. An electroluminescence element which emits light at least by application of a voltage to a first electrode and a second electrode, comprising:
    a light emitting portion and a non-light emitting portion, wherein the light emitting portion and the non-light emitting portion are provided for bringing the luminance distribution of the element into a state, wherein the light emitting portion and the non-light emitting portion are provided so that the luminance distribution is uniform as a whole,
    wherein a volume resistivity of the first electrode is higher than that of the second electrode, the first electrode being formed in a flat form, and the non-light emitting portion is provided so that the area occupied by the non-light emitting portion per unit area is greater at a position physically closer to the position of a terminal portion of the first electrode,
    wherein the electroluminescence element is an organic electroluminescence element in which at least an organic layer which emits light by application of a voltage is held between the pair of electrodes, and
    wherein the non-light emitting portion is constructed by modifying the organic layer to be incapable of emitting light.

7. An electroluminescence element which emits light at least by application of a voltage to a first electrode and a second electrode, comprising:
    a light emitting portion and a non-light emitting portion, wherein the light emitting portion and the non-light emitting portion are provided for bringing the luminance distribution of the element into a state, wherein the light emitting portion and the non-light emitting portion are provided so that the luminance distribution is uniform as a whole,
    wherein a volume resistivity of the first electrode is higher than that of the second electrode, the first electrode being formed in a flat form, and the non-light emitting portion is provided so that the area occupied by the non-light emitting portion per unit area is greater at a position physically closer to the position of a terminal portion of the first electrode, and
    wherein the electroluminescence element is an organic electroluminescence element in which an organic layer which emits light at least by application of a light voltage is held between the pair of electrodes, and the light emitting portions are defined by providing an electron injection layer between the cathode of the pair of electrodes and the organic layer at a plurality of locations.

8. An electroluminescence element which emits light at least by application of a voltage to a first electrode and a second electrode, comprising:

a light emitting portion and a non-light emitting portion, wherein the light emitting portion and the non-light emitting portion are provided for bringing the luminance distribution of the element into a state, wherein the light emitting portion and the non-light emitting portion are provided so that the luminance distribution is uniform as a whole, wherein a volume resistivity of the first electrode is higher than that of the second electrode, the first electrode being formed in a flat form, and the non-light emitting portion is provided so that the area occupied by the non-light emitting portion per unit area is greater at a position physically closer to the position of a terminal portion of the first electrode, and wherein the electroluminescence element is an organic electroluminescence element in which an organic layer which emits light at least by application of a voltage is held between the pair of electrodes, and the light emitting portion is constructed by modifying a predetermined area of an anode of the pair of electrodes to have a work function larger than the work function of other areas of the anode.

9. An electroluminescence element which emits light at least by application of a voltage to a first electrode and a second electrode, comprising:

a light emitting portion and a non-light emitting portion, wherein the light emitting portion and the non-light emitting portion are provided for bringing the luminance distribution of the element into a state, wherein the light emitting portion and the non-light emitting portion are provided so that the luminance distribution is uniform as a whole, wherein a volume resistivity of the first electrode is higher than that of the second electrode, the first electrode being formed in a flat form, and the non-light emitting portion is provided so that the area occupied by the non-light emitting portion per unit area is greater at a position physically closer to the position of a terminal portion of the first electrode, wherein the electroluminescence element is an organic electroluminescence element in which at least an organic layer which emits light by application of a voltage is held between the pair of electrodes, and wherein the organic layer is provided on only the area which is the light emitting portion.

10. An electroluminescence element which emits light at least by application of a voltage to a first electrode and a second electrode, comprising:

a light emitting portion and a non-light emitting portion, wherein the light emitting portion and the non-light emitting portion are provided for bringing the luminance distribution of the element into a state, wherein the light emitting portion and the non-light emitting portion are provided so that the luminance distribution is uniform as a whole wherein a volume resistivity of the first electrode is higher than that of the second electrode, the first electrode being formed in a flat form, and the non-light emitting portion is provided so that the area occupied by the non-light emitting portion per unit area is greater at a position physically closer to the position of a terminal portion of the first electrode, wherein the electroluminescence element is an organic electroluminescence element in which at least an organic layer which emits light by application of a voltage is held between the pair of electrodes, and wherein the non-light emitting portion is constructed by providing an insulating portion on at least a part of the area between the pair of electrodes.

11. The electroluminescence element according to claim 10, wherein the electroluminescence element is formed on a substrate and constructed as a bottom emission type, and light reflection layers are provided at positions between the substrate and a transparent electrode corresponding to the insulating portions.

* * * * *